United States Patent
Ishiguro et al.

(10) Patent No.: US 10,992,269 B2
(45) Date of Patent: Apr. 27, 2021

(54) COMPOUND SEMICONDUCTOR DEVICE WITH HIGH POWER AND REDUCED OFF-LEAKAGE AND METHOD FOR MANUFACTURING THE SAME

(71) Applicant: FUJITSU LIMITED, Kawasaki (JP)

(72) Inventors: Tetsuro Ishiguro, Kawasaki (JP); Atsushi Yamada, Hiratsuka (JP); Junji Kotani, Atsugi (JP); Norikazu Nakamura, Sagamihara (JP); Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 28 days.

(21) Appl. No.: 16/032,423

(22) Filed: Jul. 11, 2018

(65) Prior Publication Data
US 2019/0020318 A1    Jan. 17, 2019

(30) Foreign Application Priority Data

Jul. 13, 2017 (JP) .............................. JP2017-137262

(51) Int. Cl.
| H01L 31/072 | (2012.01) |
| H03F 3/19 | (2006.01) |
| H01L 29/66 | (2006.01) |
| H01L 29/778 | (2006.01) |
| H01L 29/207 | (2006.01) |
| H01L 21/02 | (2006.01) |

(Continued)

(52) U.S. Cl.
CPC ........... *H03F 3/19* (2013.01); *H01L 21/0254* (2013.01); *H01L 21/0262* (2013.01); *H01L 21/02458* (2013.01); *H01L 21/02505* (2013.01); *H01L 21/02579* (2013.01); *H01L 21/02581* (2013.01); *H01L 29/207* (2013.01); *H01L 29/66462* (2013.01); *H01L 29/7786* (2013.01); *H01L 29/7787* (2013.01); *H03F 1/3247* (2013.01); *H01L 29/2003* (2013.01)

(58) Field of Classification Search
None
See application file for complete search history.

(56) References Cited

U.S. PATENT DOCUMENTS

| 9,166,031 B2 * | 10/2015 | Kotani ............. H01L 21/02579 |
| 2005/0173728 A1 | 8/2005 | Saxler |

(Continued)

FOREIGN PATENT DOCUMENTS

| JP | 2007-221100 A | 8/2007 |
| JP | 2010-123725 A | 6/2010 |

(Continued)

OTHER PUBLICATIONS

Office Action dated Jan. 5, 2021, issued in counterpart JP Application No. 2017-137262, with English translation (8 pages).

*Primary Examiner* — Hung K Vu
(74) *Attorney, Agent, or Firm* — Westerman, Hattori, Daniels & Adrian, LLP (57) ABSTRACT

A compound semiconductor device includes a first compound semiconductor layer containing a p-type impurity, a second compound semiconductor layer disposed over the first compound semiconductor layer and containing InGaN, an electron transit layer disposed over the second compound semiconductor layer, and an electron supply layer disposed over the electron transit layer.

15 Claims, 9 Drawing Sheets

(51) Int. Cl.
*H03F 1/32* (2006.01)
*H01L 29/20* (2006.01)

(56) References Cited

U.S. PATENT DOCUMENTS

| | | | |
|---|---|---|---|
| 2005/0263791 A1* | 12/2005 | Yanagihara | H01L 29/155 |
| | | | 257/194 |
| 2006/0255364 A1 | 11/2006 | Saxler et al. | |
| 2008/0258135 A1 | 10/2008 | Hoke et al. | |
| 2010/0123169 A1 | 5/2010 | Sato | |
| 2010/0187570 A1 | 7/2010 | Saxler et al. | |
| 2010/0244101 A1 | 9/2010 | Kokawa et al. | |
| 2014/0353674 A1 | 12/2014 | Kinoshita et al. | |

FOREIGN PATENT DOCUMENTS

| | | |
|---|---|---|
| JP | 2010-525572 A | 7/2010 |
| JP | 2010239034 A | 10/2010 |
| JP | 2014-232805 A | 12/2014 |

\* cited by examiner

COMPOUND SEMICONDUCTOR DEVICE WITH HIGH POWER AND REDUCED OFF-LEAKAGE AND METHOD FOR MANUFACTURING THE SAME

CROSS-REFERENCE TO RELATED APPLICATION

This application is based upon and claims the benefit of priority of Japanese Patent Application No. 2017-137262 filed on Jul. 13, 2017, the entire contents of which are incorporated herein by reference.

FIELD

An aspect of this disclosure relates to a compound semiconductor device and a method of manufacturing the compound semiconductor device.

BACKGROUND

Application of nitride semiconductors having a high saturation electron velocity and a wide band gap to high-voltage, high-power semiconductor devices is being considered. For example, GaN, which is a nitride semiconductor, has a band gap of 3.4 eV that is greater than the band gap (1.1 eV) of Si and the band gap (1.4 eV) of GaAs, and has a high breakdown field strength. For this reason, GaN is a very promising material for a high-voltage-operation, high-power semiconductor device for a power supply.

As semiconductor devices using nitride semiconductors, high-output, high-frequency devices using two-dimensional electron gas (2DEG) as a transit carrier are being developed (see, for example, Japanese Laid-Open Patent Publication No. 2010-525572 and Japanese Laid-Open Patent Publication No. 2010-123725). The 2DEG is generated at high density at an interface by using a strong polarizing effect that is specific to a nitride material. A GaN high electron mobility transistor (GaN-HEMT) is a typical example of such semiconductor devices.

As a major characteristic, a GaN-HEMT is capable of high-power operation because 2DEG, which is used as a transit carrier, is generated at high concentration in an electron transit layer.

On the other hand, due to high electron density, off-leakage tends to occur in a GaN-HEMT during off-operation and degrades high-frequency characteristics of the GaN-HEMT. Off-leakage indicates a phenomenon where a leakage current flows around a depletion layer extending in a direction from a gate electrode toward a substrate and flows via a buffer layer between a source electrode and a drain electrode.

Particularly, if gate capacitance is to be reduced by decreasing the gate length to obtain a high current-gain cutoff frequency (fT) that is an important factor in high-frequency characteristics, the off-leakage becomes further prominent. However, achieving the high power (high carrier density) and suppressing the off-leakage of a device are generally in a trade-off relationship, and it is difficult to satisfy both of them.

SUMMARY

According to an aspect of this disclosure, there is provided a compound semiconductor device that includes a first compound semiconductor layer containing a p-type impurity, a second compound semiconductor layer disposed over the first compound semiconductor layer and containing InGaN, an electron transit layer disposed over the second compound semiconductor layer, and an electron supply layer disposed over the electron transit layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An aspect of this disclosure makes it possible to provide a highly-reliable compound semiconductor device where both high power and off-leakage suppression are sufficiently achieved and a method of manufacturing the compound semiconductor device.

Embodiments of the present invention are described below with reference to the accompanying drawings.

First Embodiment

Figure 1A:
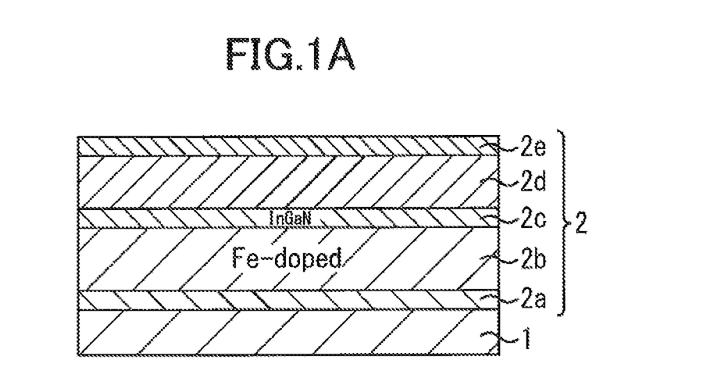
FIGS. 1A through 1C are drawings illustrating a method of manufacturing an AlGaN/GaN-HEMT according to a first embodiment.
Figure 1B:
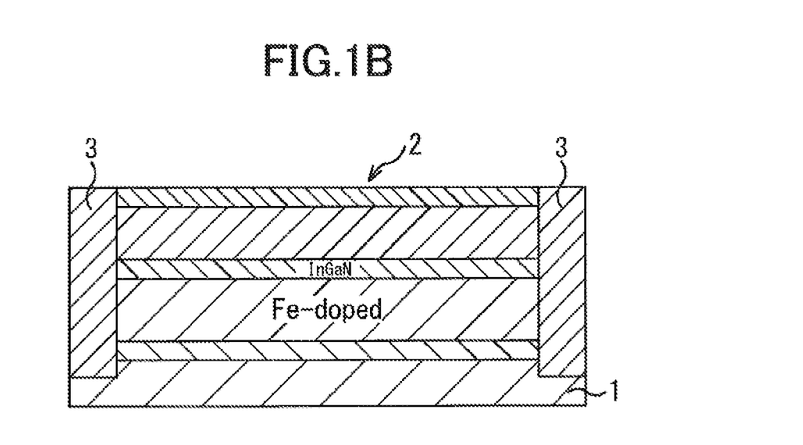
Figure 1C:
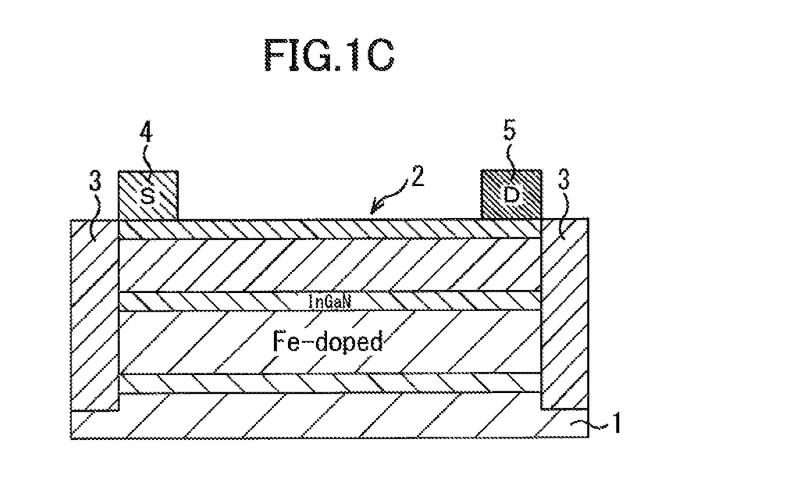
Figure 2:
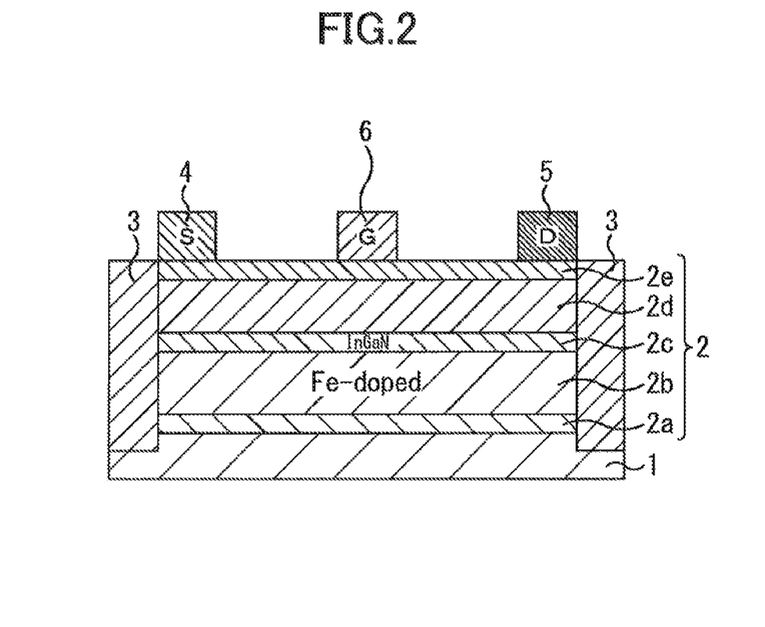
FIG. 2 is a drawing illustrating a method of manufacturing an AlGaN/GaN-HEMT according to the first embodiment.

An AlGaN/GaN-HEMT, which is a nitride semiconductor device, is described below as an example of a compound semiconductor device according to a first embodiment. FIGS. 1A through 2 are drawings illustrating a method of manufacturing an AlGaN/GaN-HEMT according to the first embodiment. FIGS. 1A through 2 do not illustrate the accurate thicknesses of layers constituting the AlGaN/GaN-HEMT.

First, as illustrated by FIG. 1A, a compound semiconductor multilayer structure 2 is formed on an Si substrate 1 that is an example of a growth substrate. As the growth substrate, an SiC substrate, a sapphire substrate, a GaAs substrate, a GaN substrate, or a ZnO substrate may also be used instead of the Si substrate. Also, the growth substrate may have either a semi-insulating property or a conductive property.

The compound semiconductor multilayer structure 2 includes an initial layer 2a, a buffer layer 2b that is a first compound semiconductor layer, a back barrier layer 2c that is a second compound semiconductor layer, an electron transit layer 2d, and an electron supply layer 2e. A thin spacer layer comprised of, for example, AlN or AlGaN may be provided between the electron transit layer 2d and the electron supply layer 2e. Also, an n-type GaN cap layer may be provided on the electron supply layer 2e.

In the AlGaN/GaN-HEMT, two-dimensional electron gas (2DEG) is generated in the electron transit layer 2d at a position near the interface between the electron transit layer 2d and the electron supply layer 2e. The 2DEG is generated due to a difference between the lattice constant of a compound semiconductor (e.g., GaN) forming the electron transit layer 2d and the lattice constant of a compound semiconductor (e.g., AlGaN) forming the electron supply layer 2e.

The compound semiconductor multilayer structure 2 is formed by growing compound semiconductors on the Si substrate 1 by, for example, metal-organic vapor-phase epitaxy (MOVPE) as described below.

Instead of MOVPE, any other appropriate method such as molecular beam epitaxy (MBE) may be used.

The initial layer 2a is formed by growing GaN, AlN, or AlGaN (e.g., AlN) on the Si substrate 1 to a thickness between several nm and several hundred nm (e.g., about 20 nm). The initial layer 2a is a nucleation layer. The growth conditions such as a growth temperature, a growth pressure, and a material ratio (V/III ratio) and the thickness of the initial layer 2a are set such that a GaN electron transit layer formed above the initial layer 2a can obtain high crystallinity (low dislocation–low defect density).

Next, for example, GaN (which is hereafter referred to as "lower GaN layer") is grown on the initial layer 2a to a thickness of several hundred nm (e.g., about 200 nm) at a growth temperature of, for example, about 1100° C. In the first embodiment, the lower GaN layer is doped, while being grown, with at least one p-type (acceptor) impurity selected from, for example, Fe, Mg, and C. In this example, it is assumed that the lower GaN layer is doped with Fe. Doping the lower GaN layer with a p-type impurity makes it possible to suppress the flow of a leakage current while the power is off, i.e., off-leakage. The doping concentration (peak concentration) of Fe is set at a value between about $1 \times 10^{16}$ atoms/cm$^3$ and about $1 \times 10^{18}$ atoms/cm$^3$ (e.g., $5 \times 10^{17}$ atoms/cm$^3$) which makes it possible to compensate for a residual donor impurity in the film.

Next, for example, GaN (which is hereafter referred to as "upper GaN layer") is grown to a thickness of several hundred nm (e.g., about 300 nm). In the first embodiment, subsequent to the growth of the lower GaN layer, the doping with Fe is stopped, and the upper GaN layer is grown on the lower GaN layer. The lower GaN layer is grown under a condition such as a low V/III ratio so that the flatness of the uppermost surface becomes sufficient. The lower GaN layer and the upper GaN layer constitute the buffer layer 2b.

Next, InGaN is grown on the buffer layer 2b at a low growth temperature of, for example, 800° C. to a thickness between about 1 nm and about 2 nm (e.g., about 1 nm). Because of the comparatively low growth temperature, the carbon (C) concentration in InGaN becomes higher than the carbon concentration in the buffer layer 2b. The back barrier effect of InGaN increases as the composition ratio of "In" increases. However, to prevent the occurrence of off-leakage due to a decrease in the conduction band potential in InGaN, the composition ratio of "In" is set at a value between, for example, about 5% and about 15% (e.g., about 5%). As a result, the InGaN back barrier layer 2c is formed on the buffer layer 2b.

Next, the electron transit layer 2d, which functions as a channel layer, is formed by growing i (intentionally-undoped)-GaN on the back barrier layer 2c to a thickness of about 200 nm. Because the electron transit layer 2d needs to be of high quality (with low impurity concentration), the growth pressure, the growth temperature, and the V/III ratio for growing the electron transit layer 2d are preferably higher than those for growing the lower GaN layer and the upper GaN layer of the buffer layer 2b, and also the carbon concentration in the electron transit layer 2d is preferably lower than the carbon concentration in the buffer layer 2b and the back barrier layer 2c.

The electron transit layer 2d may be formed in a two-layer structure. For example, a lower GaN layer of the electron transit layer 2d may be grown at a low growth temperature of about 800° C. that is the same as the growth temperature of InGaN of the back barrier layer 2c, and an upper GaN layer of the electron transit layer 2d may be subsequently grown at a growth temperature of, for example, about 1100° C. that is higher than the growth temperature of the lower GaN layer. In this case, the upper GaN layer practically functions as a channel layer, and 2DEG is generated near an interface between the upper GaN layer and the electron supply layer 2e. Forming the electron transit layer 2d in the two-layer structure makes it possible to prevent "In" from being removed from the back barrier layer 2c as a result of changing the growth condition for growing InGaN of the back barrier layer 2c to the growth condition for growing GaN of the electron transit layer 2d (i.e., to a higher growth temperature).

Next, the electron supply layer 2e is formed on the electron transit layer 2d by growing AlGaN on the electron transit layer 2d to a thickness of about 20 nm.

Through the above process, the compound semiconductor multilayer structure 2 is formed on the Si substrate 1.

Growth conditions of the respective layers of the compound semiconductor multilayer structure 2 are described below.

As a growth condition for AlN, a mixed gas of a trimethylaluminum (TMA) gas and an ammonia (NH$_3$) gas is used as a source gas. As a growth condition for GaN, a mixed gas of a trimethylgallium (TMG) gas and an NH$_3$ gas is used as a source gas. As a growth condition for InGaN, a mixed gas of a trimethylindium (TMI) gas, a TMG gas, and an NH$_3$ gas is used as a source gas. As a growth condition for AlGaN, a mixed gas of a TMA gas, a TMG gas, and an NH$_3$ gas is used as a source gas. To grow GaN while doping GaN with Fe, ferrocene (Cp2F) is used. Depending on a compound semiconductor layer to be grown, the supply and the flow rates of the TMG gas (Ga source), the TMI gas (In source), and the TMA gas (Al source) are set appropriately. The flow rate of the NH$_3$ gas, which is a common material, is set at a value between about 100 ccm and about 10 LM. Also, the growth pressure is set at a value between about 50 Torr and about 300 Torr, and the growth temperature is set at a value between about 800° C. and about 1200° C. All source gases are supplied into an MOVPE reactor by a carrier gas that is flow-controlled by a mass flow controller (MFC).

Next, as illustrated in FIG. 1B, a device isolation structure 3 is formed.

For example, argon (Ar) is injected into device isolation regions of the compound semiconductor multilayer structure 2. As a result, the device isolation structure 3 is formed in the compound semiconductor multilayer structure 2 and in the superficial portion of the Si substrate 1. The device isolation structure 3 defines an active region on the compound semiconductor multilayer structure 2.

Instead of the injection method, the device isolation may be performed by shallow trench isolation (STI). In this case, for example, a chlorine-based etching gas may be used for dry etching of the compound semiconductor multilayer structure 2.

Next, as illustrated in FIG. 1C, a source electrode 4 and a drain electrode 5 are formed.

First, a resist mask for forming the source electrode 4 and the drain electrode 5 is formed. In this example, an eaves-structure two-layer resist suitable for a vapor deposition technique and a lift-off technique is used. The resist is applied to the compound semiconductor multilayer structure 2, and openings are formed in the resist to expose electrode-forming regions. As a result, a resist mask with the openings is formed.

Electrode materials such as Ti and Al (Ti for the lower layer, and Al for the upper layer) are deposited by, for example, vapor deposition on the resist mask including the openings exposing the electrode-forming regions. The thickness of Ti is about 20 nm, and the thickness of Al is about 200 nm. Next, the resist mask and Ti and Al deposited on the resist mask are removed by a lift-off technique. Then, the Si substrate 1 is heat-treated in, for example, a nitrogen atmosphere at a temperature between about 400° C. and about 1000° C. (e.g., 600° C.) to form an ohmic contact between remaining Ti and Al and the electron supply layer 2e. As long as the ohmic contact can be formed between Ti and Al and the electron supply layer 2e, the heat treatment may be omitted. Through the above process, the source electrode 4 and the drain electrode 5 are formed on the electron supply layer 2e.

Next, as illustrated in FIG. 2, a gate electrode 6 is formed.

First, a resist mask for forming the gate electrode 6 is formed. In this example, an eaves-structure two-layer resist suitable for a vapor deposition technique and a lift-off technique is used. The resist is applied to the compound semiconductor multilayer structure 2, and an opening is formed in the resist by photolithography to expose an electrode-forming region on the electron supply layer 2e. As a result, a resist mask with the opening is formed.

Electrode materials such as Ni and Au (Ni for the lower layer, and Au for the upper layer) are deposited by, for example, vapor deposition on the resist mask including the opening exposing the electrode-forming region. The thickness of Ni is about 30 nm, and the thickness of Au is about 400 nm.

Next, the resist mask and Ni and Au deposited on the resist mask are removed by a lift-off technique.

Through the above process, the gate electrode 6 is formed on the electron supply layer 2e.

After forming the gate electrode 6, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the AlGaN/GaN-HEMT of the first embodiment.

Effects of the AlGaN/GaN-HEMT of the first embodiment are described below.

Figure 3:
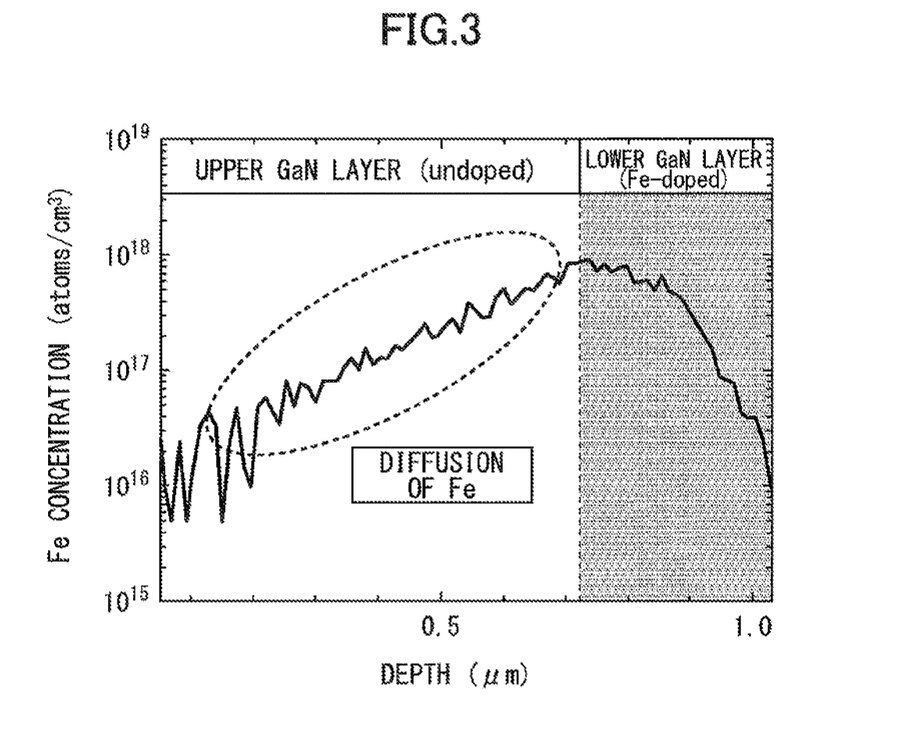
FIG. 3 is a graph illustrating an Fe concentration profile in a buffer layer of an AlGaN/GaN-HEMT according to the first embodiment.
Figure 4:
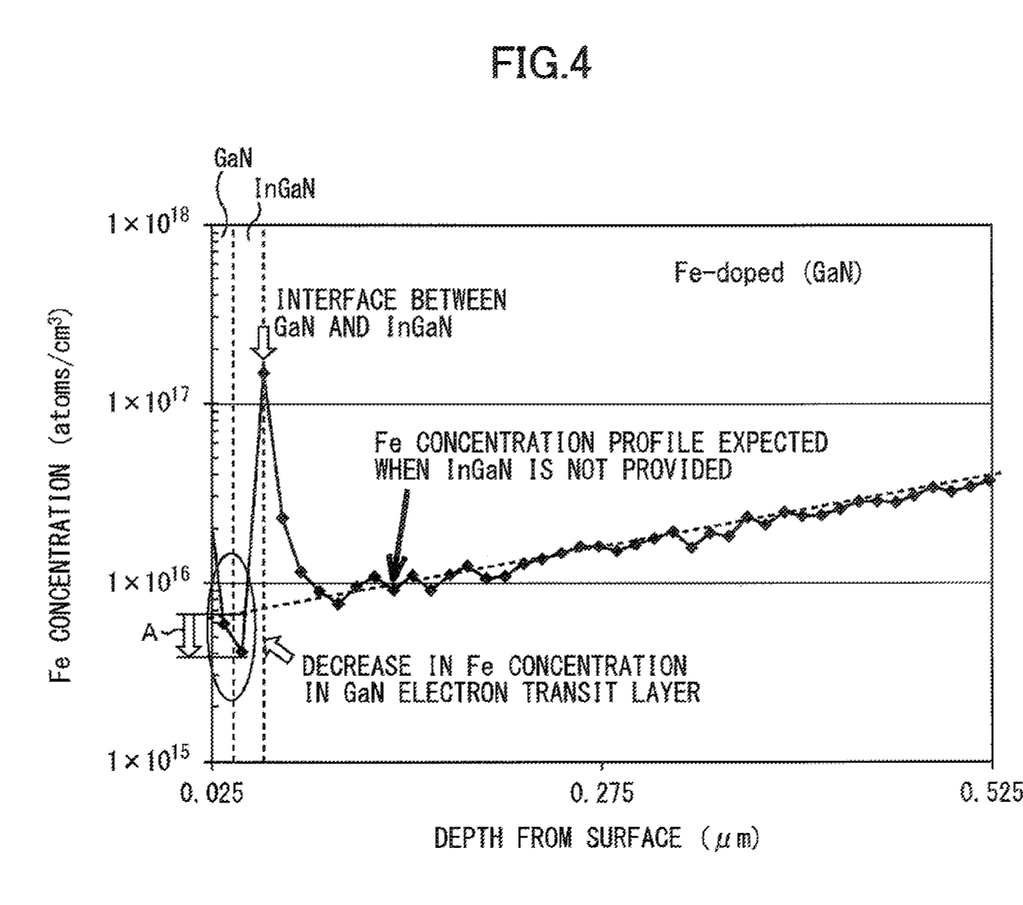
FIG. 4 is a graph illustrating an Fe concentration profile in a buffer layer, a back barrier layer, and an electron transit layer of an AlGaN/GaN-HEMT according to the first embodiment.

FIG. 3 is a graph illustrating an Fe concentration profile in the buffer layer 2b of the AlGaN/GaN-HEMT according to the first embodiment. FIG. 4 is a graph illustrating an Fe concentration profile in the buffer layer 2b, the back barrier layer 2c, and the electron transit layer 2d of the AlGaN/GaN-HEMT according to the first embodiment. Both of the concentration profiles of FIGS. 3 and 4 are obtained by secondary ion mass spectrometry (SIMS).

In a GaN-HEMT, one method to suppress the off-leakage while minimizing the decrease in the 2DEG concentration is to insert an InGaN back barrier layer with a low "In" composition ratio below an electron transit layer. However, it has been found that using only the InGaN back barrier layer may instead increase the off-leakage. This is supposed to be mainly caused by the incompleteness of the InGaN crystal, which is difficult to grow. For example, the "In" composition ratio of InGaN crystal tends to become non-uniform, and InGaN formed at a low temperature tends to take in a donor impurity (oxygen). When, for example, oxygen is taken into InGaN, the oxygen forms a donor level and shifts the Fermi level of InGaN toward the conduction band. As a result, InGaN itself becomes a leakage path for conduction electrons and increases the off-leakage. Similarly, when the "In" composition ratio becomes greater than a design value, the conduction band potential of InGaN decreases and the off-leakage increases. Thus, it is difficult to suppress the off-leakage in a high-power GaN-HEMT by using only the InGaN back barrier layer, and it is extremely difficult to achieve both the high power and the suppression of the off-leakage.

In the AlGaN/GaN-HEMT of the first embodiment, in addition to the InGaN back barrier layer 2c, the buffer layer 2b including Fe as a p-type impurity is provided below the back barrier layer 2c. As described above, the buffer layer 2b includes the lower GaN layer that is grown while being doped with Fe and the upper GaN layer that is grown without being doped with Fe. As illustrated in FIG. 3, after the buffer layer 2b is formed, Fe in the lower GaN layer tends to diffuse from the lower GaN layer toward the upper GaN layer.

In the first embodiment, the above characteristic of the buffer layer 2b has an advantageous effect. That is, the diffused Fe suppresses the decrease in the conduction band potential of InGaN caused by a donor (n-type) impurity in the back barrier layer 2c, and the back barrier layer 2c prevents Fe from diffusing to the 2DEG region in the electron transit layer 2d. As illustrated in FIG. 4, because InGaN of the back barrier layer 2c is formed at a low temperature, the intake rate (which depends on the growth temperature and increases as the growth temperature decreases) of Fe sharply increases at the interface between the back barrier layer 2c and the electron transit layer 2d. Due to the sharp increase of the intake rate, a large proportion of Fe is consumed and the diffusion of Fe to the electron transit layer 2d is suppressed by the back barrier layer 2c. In FIG. 4, a dotted line indicates an Fe concentration profile according to a comparative example that is expected when the back barrier layer 2c is not provided. An arrow A indicates a decrease in the Fe concentration in the electron transit layer 2d of the first embodiment compared with the Fe concentration in the comparative example.

Figure 5:
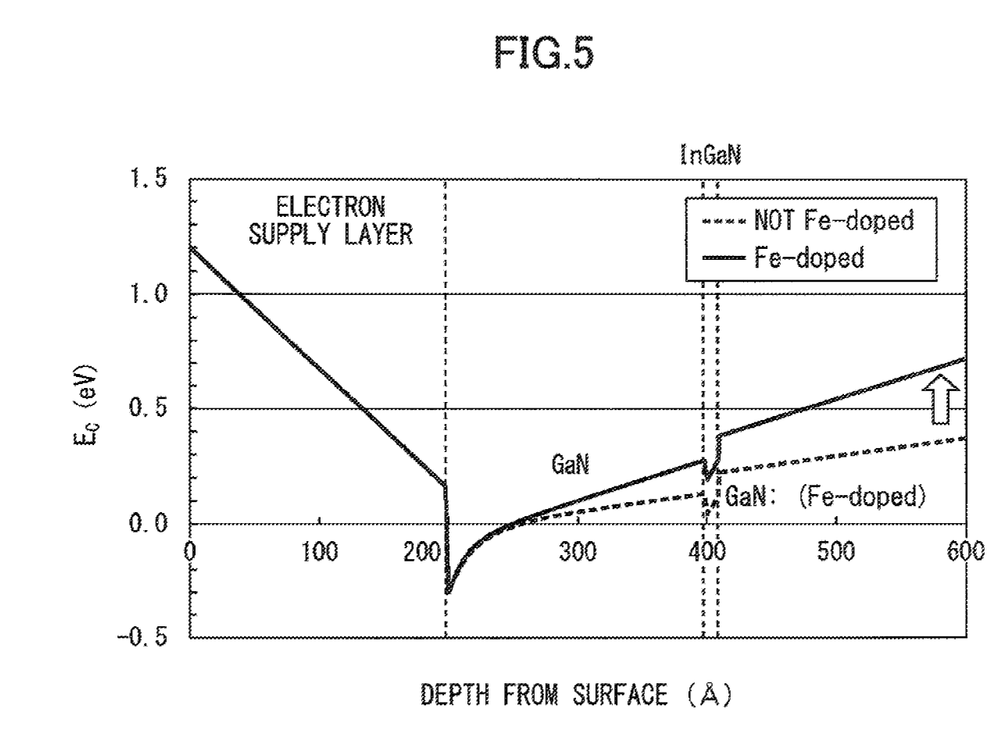
FIG. 5 is a graph illustrating band profiles of AlGaN/GaN-HEMTs according to the first embodiment and a comparative example.

FIG. 5 is a graph illustrating band profiles of AlGaN/GaN-HEMTs according to the first embodiment and a comparative example. Each of the band profiles is obtained by calculating the conduction band potential at the gate electrode through one dimensional (1D) simulation. The AlGaN/GaN-HEMT of the comparative example also includes an InGaN back barrier layer but is different from the AlGaN/GaN-HEMT of the first embodiment in that the buffer layer is not doped with Fe.

In both of the first embodiment and the comparative example, it is assumed that a GaN electron transit layer with a thickness of 200 nm is formed on an InGaN back barrier layer with a thickness of 1 nm and an "In" composition ratio of 5%, and an AlGaN electron supply layer with a thickness of 20 nm and an "Al" composition ratio of 5% is formed on the electron transit layer. It is also assumed that the lower GaN layer of the buffer layer of the first embodiment has a thickness of 300 nm and is doped with Fe at a doping concentration of $3 \times 10^{17}$ atoms/cm$^3$. The acceptor level of Fe is assumed to be 1 eV from the valence band. As is apparent from the calculation results of FIG. 5, the level of the conduction band potential on the substrate side in the first embodiment is higher than that in the comparative example. This indicates that the back barrier effect, i.e., an effect to suppress the off-leakage, is enhanced in the first embodiment.

Figure 6A:
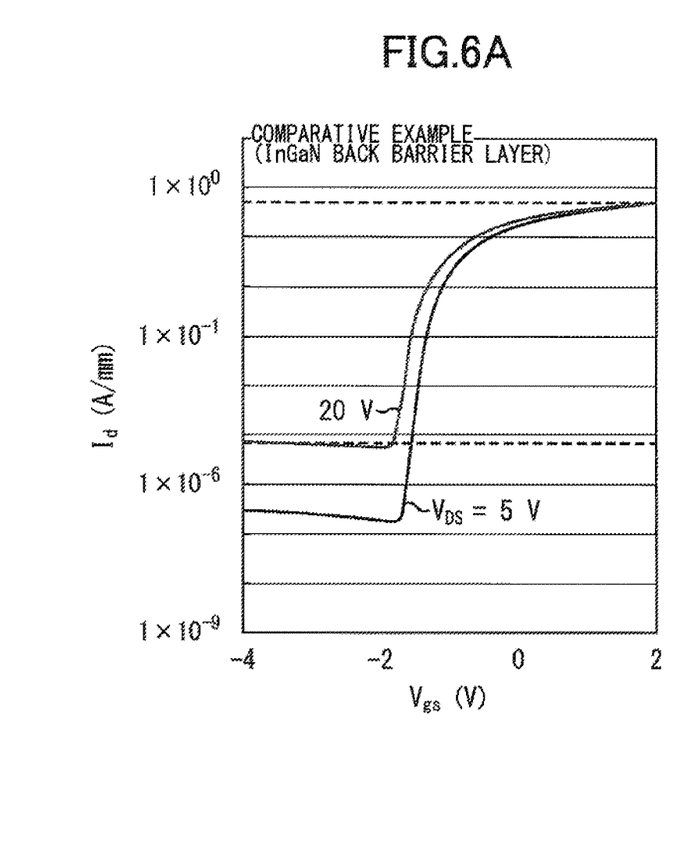
FIGS. 6A and 6B are graphs illustrating Id-Ig characteristics of AlGaN/GaN-HEMTs according to the first embodiment and a comparative example.
Figure 6B:
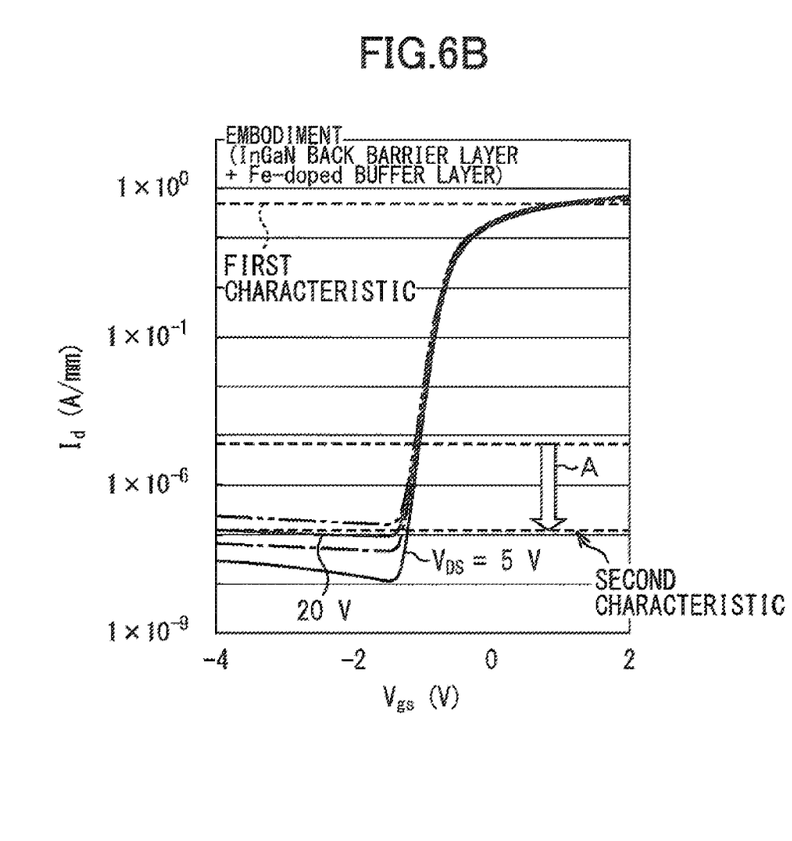

FIG. 6A is a graph illustrating an Id-Ig characteristic of an AlGaN/GaN-HEMT according to a comparative example, and FIG. 6B is a graph illustrating an Id-Ig characteristic of an AlGaN/GaN-HEMT according to the first embodiment. The AlGaN/GaN-HEMT of the comparative example also includes an InGaN back barrier layer but is different from the AlGaN/GaN-HEMT of the first embodiment in that the buffer layer is not doped with Fe.

The results of FIGS. 6A and 6B indicate two characteristics of the AlGaN/GaN-HEMT of the first embodiment. As a first characteristic, as indicated by an arrow A in FIG. 6B, the off-leakage in the first embodiment is decreased by about two orders of magnitude compared with the comparative example because of the back barrier enhancing effect that is achieved by using both of the back barrier layer and the buffer layer containing Fe. As a second characteristic, the decrease of 2DEG resulting from diffusion of Fe to the electron transit layer is suppressed because the saturation value of the drain current is substantially the same in the first embodiment and the comparative example. Thus, the first embodiment can achieve both high power and off-leakage suppression.

As described above, the first embodiment makes it possible to provide a highly-reliable AlGaN/GaN-HEMT where both high power and off-leakage suppression are sufficiently achieved.

Second Embodiment

Figure 7A:
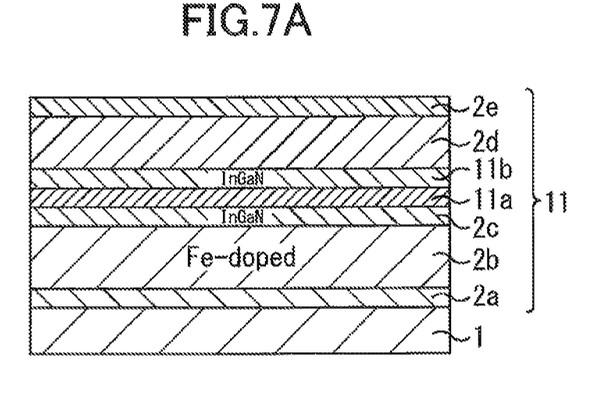
FIGS. 7A through 7C are drawings illustrating a method of manufacturing an AlGaN/GaN-HEMT according to a second embodiment.
Figure 7B:
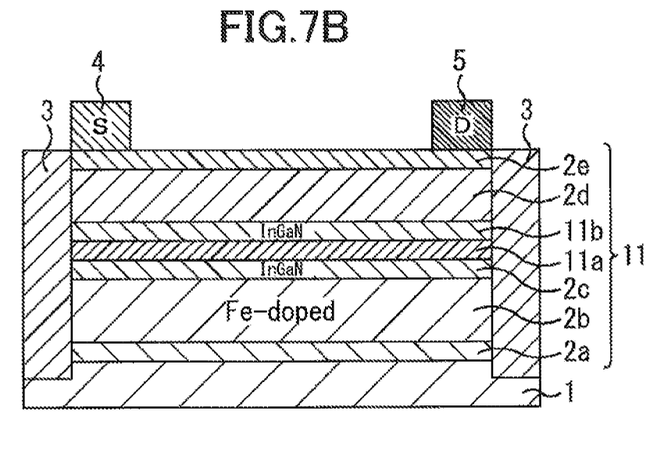
Figure 7C:
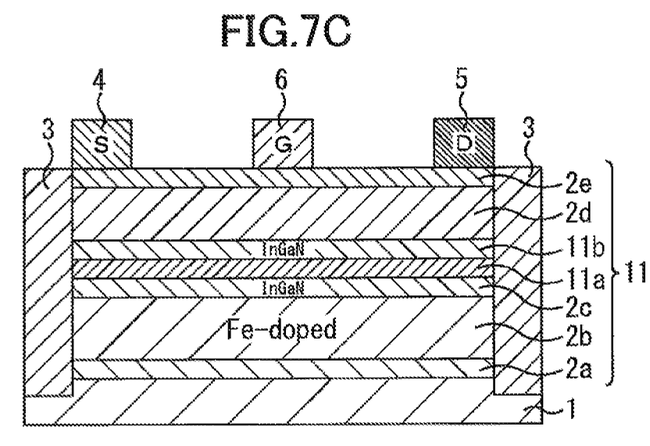

An AlGaN/GaN-HEMT of a second embodiment is different from the AlGaN/GaN-HEMT of the first embodiment in the configuration of a compound semiconductor multilayer structure. FIGS. 7A through 7C are drawings illustrating a method of manufacturing the AlGaN/GaN-HEMT according to the second embodiment. The same reference numbers as in the first embodiment are assigned to components that are substantially the same as those of the AlGaN/GaN-HEMT of the first embodiment, and detailed descriptions of those components are omitted.

First, as illustrated by FIG. 7A, a compound semiconductor multilayer structure 11 is formed on an Si substrate 1.

The compound semiconductor multilayer structure 11 includes an initial layer 2a, a buffer layer 2b that is a first compound semiconductor layer, a back barrier layer 2c that is a second compound semiconductor layer, an intermediate layer 11a that is a third compound semiconductor layer, a back barrier layer 11b that is a fourth compound semiconductor layer, an electron transit layer 2d, and an electron supply layer 2e.

In this example, the compound semiconductor multilayer structure 11 includes one structure that is formed by stacking the intermediate layer 11a and the back barrier layer 11b in this order. However, the compound semiconductor multilayer structure 11 may include multiple structures having the same configuration. Also, a thin spacer layer comprised of, for example, AlN or AlGaN may be provided between the electron transit layer 2d and the electron supply layer 2e. Further, an n-type GaN cap layer may be provided on the electron supply layer 2e.

The initial layer 2a, the buffer layer 2b, and the back barrier layer 2c are formed as described in the first embodiment.

Next, the intermediate layer 11a comprised of GaN is formed by growing i-GaN on the back barrier layer 2c to a thickness between about 20 nm and about 50 nm. Then, InGaN is grown on the intermediate layer 11a at a low growth temperature of, for example, about 800° C. to a thickness between about 1 nm and about 3 nm. The back barrier effect of InGaN increases as the composition ratio of "In" increases. However, to prevent the occurrence of off-leakage due to a decrease in the conduction band potential in InGaN, the composition ratio of "In" is set at a value between, for example, about 5% and about 15% (e.g., about 5%). As a result, the InGaN back barrier layer 11b is formed on the intermediate layer 11a.

Next, similarly to the first embodiment, the electron transit layer 2d and the electron supply layer 2e are formed on the back barrier layer 11b.

Through the above process, the compound semiconductor multilayer structure 11 is formed on the Si substrate 1. The compound semiconductor multilayer structure 11 includes two back barrier layers. The number of back barrier layers may be further increased by inserting multiple structures each consisting of the intermediate layer 11a and the back barrier layer 11b between the back barrier layer 2c and the electron transit layer 2d.

Next, similarly to FIGS. 1B and 1C of the first embodiment, a device isolation structure 3, a source electrode 4, and a drain electrode 5 are formed as illustrated by FIG. 7B.

Then, similarly to FIG. 2 of the first embodiment, a gate electrode 6 is formed as illustrated by FIG. 7C.

After forming the gate electrode 6, various processes such as formation of an interlayer dielectric film, formation of wiring connected to the source electrode 4, the drain electrode 5, and the gate electrode 6, formation of an upper-layer protection film, and formation of connection electrodes exposed on the uppermost surface are performed to produce the AlGaN/GaN-HEMT of the second embodiment.

Effects of the AlGaN/GaN-HEMT of the second embodiment are described below.

Figure 8:
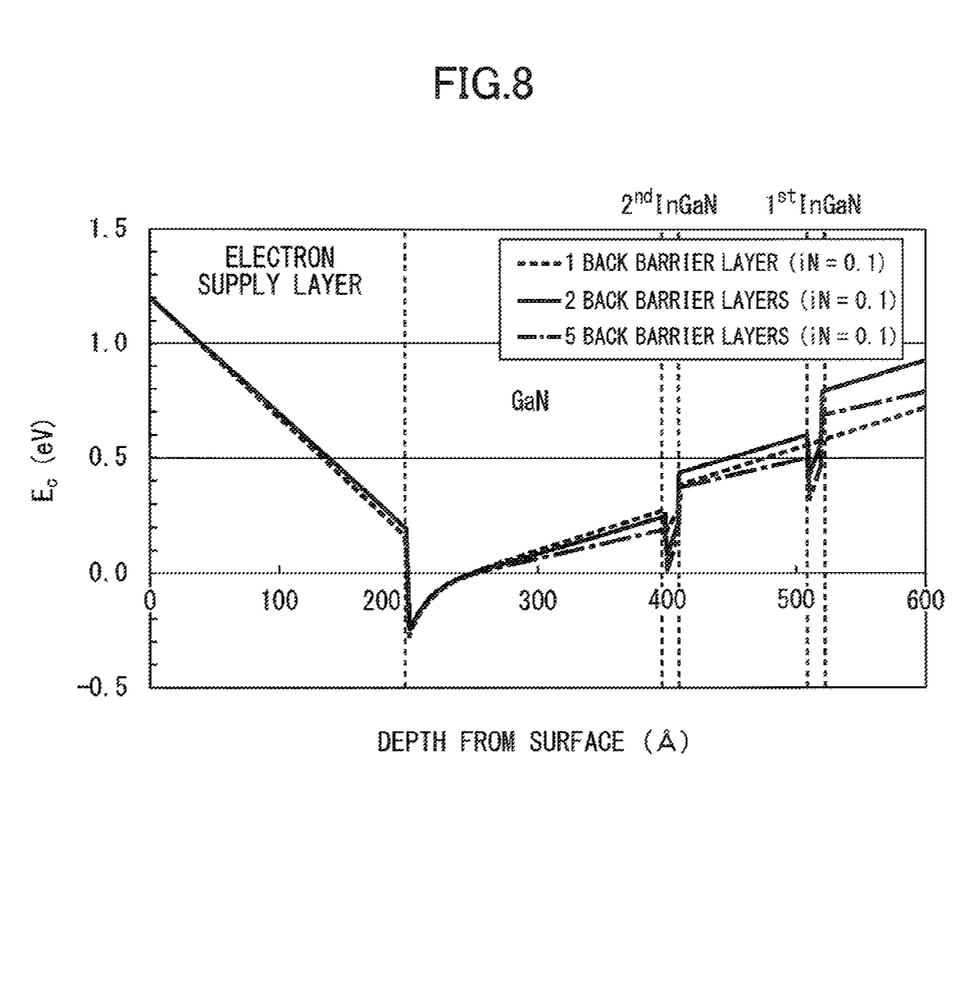
FIG. 8 is a graph illustrating band profiles of AlGaN/GaN-HEMTs according to the first and second embodiments.

FIG. 8 is a drawing illustrating band profiles of AlGaN/GaN-HEMTs according to the first and second embodiments. Each of the band profiles is obtained by calculating the conduction band potential at the gate electrode through 1D simulation. FIG. 8 illustrates a band profile in a case (first embodiment) where one back barrier layer is provided, a band profile in a case where two back barrier layers are provided, and a band profile in a case where five back barrier layers are provided.

As illustrated in FIG. 8, as the number of back barrier layers increases, the level of the conduction band potential on the buffer layer side becomes higher and the back barrier effect increases. Theoretically, the level of the conduction band potential on the buffer layer side becomes higher and the back barrier effect increases as the number of back barrier layers increases. However, according to FIG. 8, the level of the conduction band potential is highest and the maximum back barrier effect is achieved when the number of back barrier layers is two.

A square-well potential formed in a region between the InGaN back barrier layer and the GaN intermediate layer becomes deeper as the number of back barrier layers increases and becomes closer to the Fermi level as the region becomes closer to 2DEG. That is, the InGaN back barrier layer itself tends to become a leakage path. For this reason, there is a practical upper limit to the number of back barrier layers with respect to the composition ratio of "In" in the back barrier layers and the doping concentration of Fe in the buffer layer. The upper limit of the number of back barrier layers under the growth conditions in the second embodiment is supposed to be about five.

As described above, the second embodiment makes it possible to provide a highly-reliable AlGaN/GaN-HEMT where the back barrier effect is further enhanced and both high power and off-leakage suppression are sufficiently achieved.

The first and second embodiments of the present invention are described above. However, the present invention is not limited to those embodiments. For example, although Schottky AlGaN/GaN-HEMTs are described in the first and second embodiments, the present invention may also be applied to a metal-insulator semiconductor (MIS) AlGaN/GaN-HEMT that includes a gate insulating film between a compound semiconductor multilayer structure and a gate electrode. In this case, various types of insulator may be used for the gate insulating film. For example, the gate insulating film may be formed by depositing an oxide, a nitride, or an oxynitride of one of Si, Al, Hf, Zr, Ti, Ta, and W, or may be formed as a multilayer structure by depositing two or more of these substances.

Third Embodiment

A third embodiment provides a power-supply device including AlGaN/GaN-HEMTs of the first or second embodiment.

Figure 9:
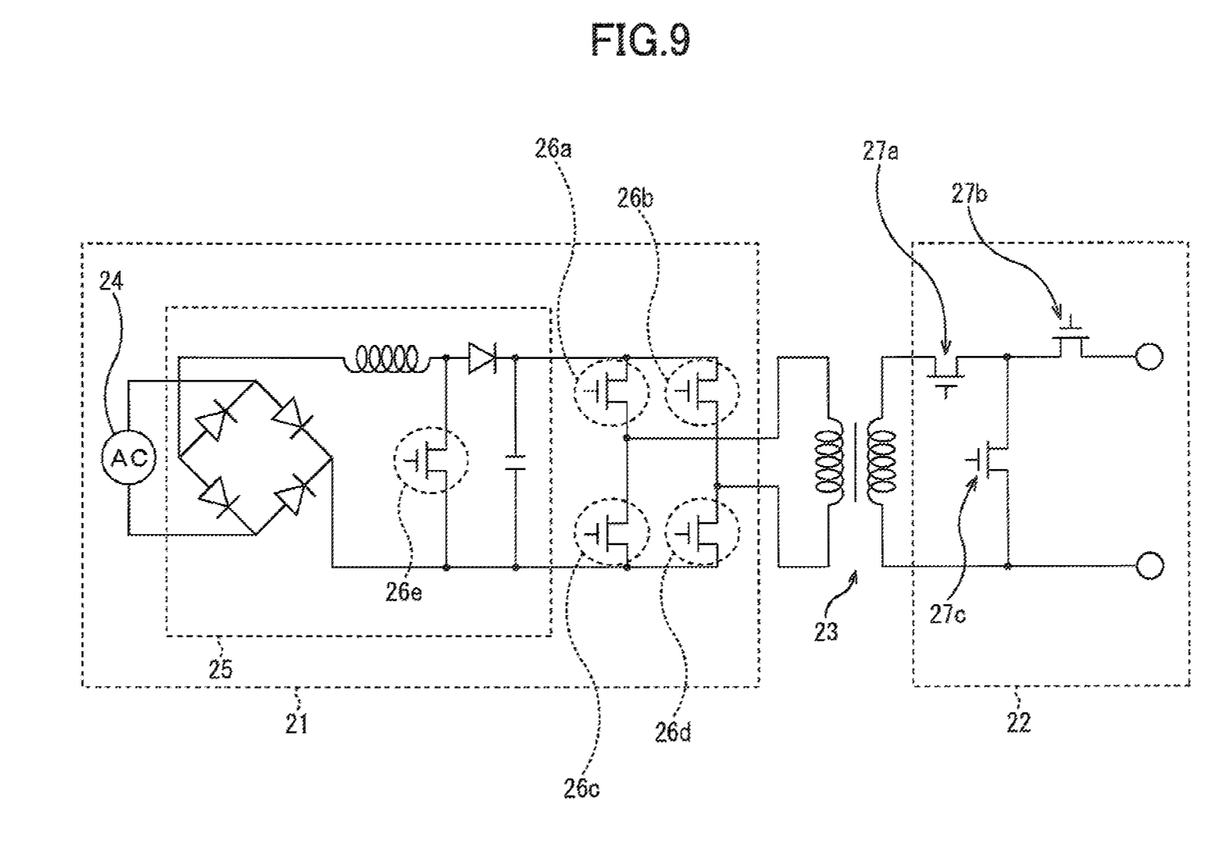
FIG. 9 is a circuit diagram illustrating a configuration of a power-supply device according to a third embodiment.

FIG. 9 is a circuit diagram illustrating a configuration of a power-supply device according to the third embodiment.

The power-supply device includes a high-voltage primary circuit 21, a low-voltage secondary circuit 22, and a transformer 23 disposed between the primary circuit 21 and the secondary circuit 22.

The primary circuit 21 includes an alternating-current power supply 24, a bridge rectifier circuit 25, and multiple (four in this example) switching elements 26a, 26b, 26c, and 26d. Also, the bridge rectifier circuit 25 includes a switching element 26e.

The secondary circuit 22 includes multiple (three in this example) switching elements 27a, 27b, and 27c.

In the third embodiment, each of the switching elements 26a, 26b, 26c, 26d, and 26e of the primary circuit 21 is implemented by an AlGaN/GaN-HEMT of the first or second embodiment. The switching elements 27a, 27b, and 27c of the secondary circuit 22 are implemented by normal MIS-FETs using silicon.

In the third embodiment, highly-reliable AlGaN/GaN-HEMTs, where both high power and off-leakage suppression are sufficiently achieved, are used for a high-voltage circuit. This in turn makes it possible to provide a highly-reliable, high-power power supply circuit.

Fourth Embodiment

A fourth embodiment provides a high-frequency amplifier including an AlGaN/GaN-HEMT of the first or second embodiment.

Figure 10:
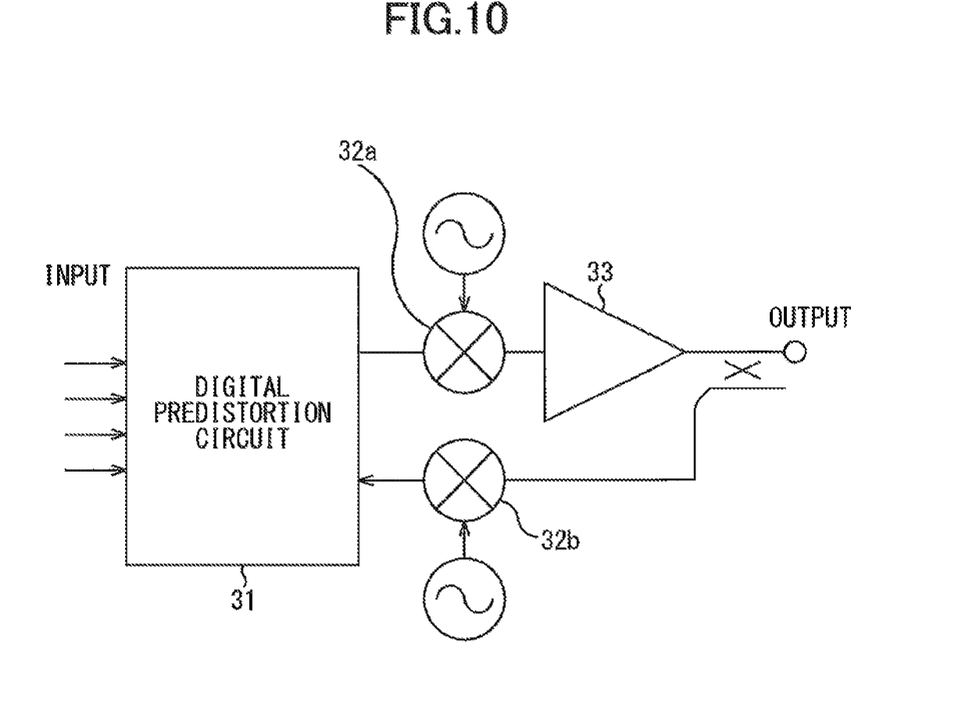
FIG. 10 is a drawing illustrating a configuration of a high-frequency amplifier according to a fourth embodiment.

FIG. 10 is a drawing illustrating a configuration of a high-frequency amplifier according to the fourth embodiment.

The high-frequency amplifier of the fourth embodiment includes a digital predistortion circuit 31, mixers 32a and 32b, and a power amplifier 33.

The digital predistortion circuit 31 compensates for non-linear distortion of an input signal. The mixer 32a mixes the input signal, whose nonlinear distortion has been compensated for, with an alternating-current signal. The power amplifier 33 amplifies the input signal mixed with the alternating-current signal and includes an AlGaN/GaN-HEMT of the first or second embodiment. With the configuration of FIG. 10, an output signal can be switched to the mixer 32b and mixed with an alternating-current signal by the mixer 32b, and the mixed signal can be output to the digital predistortion circuit 31.

In the fourth embodiment, a highly-reliable AlGaN/GaN-HEMT, where both high power and off-leakage suppression are sufficiently achieved, is used for a high-frequency amplifier. This in turn makes it possible to provide a highly-reliable high-frequency amplifier that withstands high voltage.

OTHER EMBODIMENTS

In the first through fourth embodiments, an AlGaN/GaN-HEMT is used as an example of a compound semiconductor device. However, the present invention may also be applied to other types of HEMTs as exemplified below.

First Example

The present invention may also be applied to an InAlN/GaN-HEMT that is another example of a compound semiconductor device.

InAlN and GaN are compound semiconductors whose lattice constants can be made close to each other by adjusting their composition ratios. When a compound semiconductor device in the first through fourth embodiments is implemented by an InAlN/GaN-HEMT, the electron transit layer is formed with i-GaN and the electron supply layer is formed with InAlN. In an InAlN/GaN-HEMT, because piezoelectric polarization hardly occurs, two-dimensional electron gas is mainly generated by spontaneous polarization of InAlN.

Similarly to the AlGaN/GaN-HEMTs of the first and second embodiments, the InAlN/GaN-HEMT of the first example is also highly reliable and can sufficiently achieve both high power and off-leakage suppression.

Second Example

The present invention may also be applied to an InAlGaN/GaN-HEMT that is another example of a compound semiconductor device.

GaN and InAlGaN are compound semiconductors, and the lattice constant of InAlGaN can be made smaller than the lattice constant of GaN by adjusting its composition ratios.

When a compound semiconductor device in the first through fourth embodiments is implemented by an InAlGaN/GaN-HEMT, the electron transit layer is formed with i-GaN and the electron supply layer is formed with InAlGaN.

Similarly to the AlGaN/GaN-HEMTs of the first and second embodiments, the InAlGaN/GaN-HEMT of the second example is also highly reliable and can sufficiently achieve both high power and off-leakage suppression.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a first compound semiconductor layer containing a p-type impurity;
   a second compound semiconductor layer disposed over the first compound semiconductor layer and containing InGaN;
   an electron transit layer disposed over the second compound semiconductor layer; and
   an electron supply layer disposed over the electron transit layer,
   wherein each of the electron transit layer and the second compound semiconductor layer includes carbon, and a carbon concentration in the electron transit layer is lower than a carbon concentration in the second compound semiconductor layer.

2. The compound semiconductor device as claimed in claim 1, wherein the p-type impurity includes at least one of Fe, Mg, and C.

3. The compound semiconductor device as claimed in claim 1, wherein a concentration of the p-type impurity in the first compound semiconductor layer is between $1 \times 10^{16}$ atoms/cm$^3$ and $1 \times 10^{18}$ atoms/cm$^3$.

4. The compound semiconductor device as claimed in claim 1, wherein a composition ratio of In in InGaN of the second compound semiconductor layer is between 5% and 15%.

5. The compound semiconductor device as claimed in claim 1, further comprising:
   at least one structure that is disposed between the second compound semiconductor layer and the electron transit layer and formed by stacking a third compound semiconductor layer and a fourth compound semiconductor layer containing InGaN.

6. The compound semiconductor device as claimed in claim 1, wherein the carbon concentration in the second compound semiconductor layer is higher than a carbon concentration in the first compound semiconductor layer.

7. The compound semiconductor device as claimed in claim 1, wherein the first compound semiconductor layer includes a lower layer containing the p-type impurity and an upper layer not containing the p-type impurity.

8. A method of manufacturing a compound semiconductor device, the method comprising:
   forming a first compound semiconductor layer containing a p-type impurity;
   forming a second compound semiconductor layer containing InGaN over the first compound semiconductor layer;
   forming an electron transit layer over the second compound semiconductor layer; and
   forming an electron supply layer over the electron transit layer,
   wherein each of the electron transit layer and the second compound semiconductor layer includes carbon, and a carbon concentration in the electron transit layer is lower than a carbon concentration in the second compound semiconductor layer.

9. The method as claimed in claim 8, wherein in the forming of the first compound semiconductor layer, a lower layer doped with the p-type impurity is formed and then an upper layer not doped with the p-type impurity is formed on the lower layer.

10. The method as claimed in claim 8, wherein in the forming of the electron transit layer, a lower layer is formed at a first temperature and then an upper layer is formed on the lower layer at a second temperature higher than the first temperature.

11. The method as claimed in claim 8, wherein the p-type impurity includes at least one of Fe, Mg, and C.

12. The method as claimed in claim 8, wherein a concentration of the p-type impurity in the first compound semiconductor layer is between $1 \times 10^{16}$ atoms/cm$^3$ and $1 \times 10^{18}$ atoms/cm$^3$.

13. The method as claimed in claim 8, wherein a composition ratio of In in InGaN of the second compound semiconductor layer is between 5% and 15%.

14. The method as claimed in claim 8, further comprising:
   forming at least one structure, between the second compound semiconductor layer and the electron transit layer, by stacking a third compound semiconductor layer and a fourth compound semiconductor layer containing InGaN.

15. A high-frequency amplifier, comprising:
   a power amplifier that amplifies an input signal and includes a transistor,
   wherein the transistor includes
      a first compound semiconductor layer containing a p-type impurity,
      a second compound semiconductor layer disposed over the first compound semiconductor layer and containing InGaN,
      an electron transit layer disposed over the second compound semiconductor layer, and
      an electron supply layer disposed over the electron transit layer,
   wherein each of the electron transit layer and the second compound semiconductor layer includes carbon, and a carbon concentration in the electron transit layer is lower than a carbon concentration in the second compound semiconductor layer.

* * * * *